(12) United States Patent
Tu et al.

(10) Patent No.: US 6,682,982 B1
(45) Date of Patent: Jan. 27, 2004

(54) PROCESS METHOD FOR 1T-SRAM

(75) Inventors: Kuo-Chi Tu, Hsin-Chu (TW);
Chun-Yao Chen, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/263,540

(22) Filed: Oct. 3, 2002

(51) Int. Cl.[7] .............................................. H01L 21/20
(52) U.S. Cl. ...................... 438/386; 438/210; 438/239; 438/245; 438/248; 438/381; 438/386; 438/391; 257/68; 257/71; 257/260; 257/277; 257/516
(58) Field of Search ..................... 438/210, 239–245, 438/248, 381, 386–388, 391; 257/68–71, 260, 277, 516

(56) References Cited

U.S. PATENT DOCUMENTS

| | | | |
|---|---|---|---|
| 5,073,515 A | 12/1991 | Roehl et al. | 437/52 |
| 5,374,580 A | 12/1994 | Baglee et al. | 437/52 |
| 5,867,420 A * | 2/1999 | Alsmeier | 365/149 |
| 6,100,131 A * | 8/2000 | Alsmeier | 438/243 |
| 6,256,248 B1 | 7/2001 | Leung | 365/222 |
| 6,303,502 B1 | 10/2001 | Hsu et al. | 438/680 |
| 6,399,977 B1 * | 6/2002 | Alsmeier | 257/301 |
| 6,509,599 B1 * | 1/2003 | Wurster et al. | 257/301 |
| 6,528,367 B1 * | 3/2003 | Lee | 438/253 |
| 6,566,190 B2 * | 5/2003 | Lee et al. | 438/242 |
| 6,569,747 B1 * | 5/2003 | Achuthan et al. | 438/424 |
| 2003/0042524 A1 * | 3/2003 | Lee et al. | 257/301 |

* cited by examiner

*Primary Examiner*—Matthew Smith
*Assistant Examiner*—Granvill D Lee, Jr.
(74) *Attorney, Agent, or Firm*—George O. Saile; Stephen B. Ackerman; Stephen G. Stanton

(57) ABSTRACT

A method of forming a cell memory structure including the step of planarizing an HDP/LDP oxide layer lying over a capacitor area. The method provides for the planarization of the cell storage node, good isolation between the transistor and storage node, reduced step height for the cell-transistor and has the potential for increasing the node capacitance (like DRAM storage node).

37 Claims, 7 Drawing Sheets

US 6,682,982 B1

PROCESS METHOD FOR 1T-SRAM

FIELD OF THE INVENTION

The present invention relates generally to semiconductor fabrication and more specifically to fabrication of 1T-SRAMs.

BACKGROUND OF THE INVENTION

Integration of memory in system-on-chip is further complicated by the incompatibility of memory process technology with the logic process. The simplicity of a one transistor-static random access memory (1T-SRAM) cell facilitates its easy porting to most processes. This helps alleviate the problem of process incompatibility. The simplicity of the 1T-SRAM cell also makes it very scalable and cost effective.

However, the 1T-SRAM cell process design needs to be compatible with the logic process with a lower thermal budget requirement while continuing to shrink the device size. Therefore a buried storage node, like a DRAM trench, on a shallow trench isolation (STI) structure and the word line overlying the buried storage node is one of the 1T-SRAM cell design processes. This design will meet the smaller cell size, but it will suffer from a high step height for the cell transistor gate and leakage between the transistor and storage node.

U.S. Pat. No. 6,256,248 B1 to Leung describes a method and apparatus for increasing the time available for internal refresh for 1T-SRAM compatible devices.

U.S. Pat. No. 6,303,502 B1 to Hsu et al. describes a 1T memory device and process.

U.S. Pat. No. 5,374,580 to Baglee et al. describes a 1T memory process.

U.S. Pat. No. 5,073,515 to Roehl et al. describes another 1T memory process.

SUMMARY OF THE INVENTION

Accordingly, it is an object of one or more embodiments of the present invention to provide an improved method of forming a cell memory structure.

Other objects will appear hereinafter.

It has now been discovered that the above and other objects of the present invention may be accomplished in the following manner. Specifically, a substrate having an isolation trench formed therein is provided. An isolation structure is formed within the isolation trench. A pad oxide layer is formed over the substrate and the isolation structure. A first dielectric layer is formed over the pad oxide layer. The first dielectric layer, the pad oxide layer and the isolation structure are patterned to form at least: 1) an initial node within the isolation trench; a portion of the initial node having an overlying patterned pad oxide layer portion and an overlying patterned first dielectric layer portion; and 2) patterned first dielectric portions having underlying pad oxide layer portions over the substrate adjacent the isolation trench. A bottom dielectric layer is formed over: the initial node; the substrate; and the patterned first dielectric layer portions over the substrate. A portion of the bottom dielectric layer is removed, leaving a partially removed bottom dielectric layer overlying at least: the isolation trench; the initial node; and any exposed substrate adjacent the isolation trench. A planarized second dielectric layer is formed over the structure at least filling isolation trench and overlying the initial node and the patterned first dielectric layer portions over the substrate. A portion of the planarized second dielectric layer is removed leaving only recessed portions of the second dielectric layer within isolation trench. Then removing: i) a portion of the bottom dielectric layer overlying the initial node adjacent the patterned first dielectric layer portion, leaving a portion of the initial node exposed; and ii) the patterned first dielectric layer portion from the initial node. Removing: the second dielectric layer recessed portions; the patterned pad oxide layer portion overlying the initial node; and the exposed portion of the initial node to leave a final node. A cap dielectric layer is formed over the structure. A top plate dielectric layer is formed over the cap dielectric layer and at least filling the isolation trench, overlying the final node and the patterned first dielectric layer portions over the substrate. The top plate dielectric layer is planarized, stopping on the patterned first dielectric layer portions over the substrate. An ARC layer is formed over the planarized top plate dielectric layer. Patterning: the ARC layer; and the patterned first dielectric layer portions over the substrate to expose side walls, stopping on the underlying pad oxide layer portions. Forming sidewall spacers on the exposed side walls of the twice patterned first dielectric layer portions over the substrate, leaving peripheral portions of the underlying pad oxide layer exposed. The peripheral exposed portions of the underlying pad oxide layer are removed to leave remaining pad oxide layer portions and forming the cell memory structure.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Figure 1:
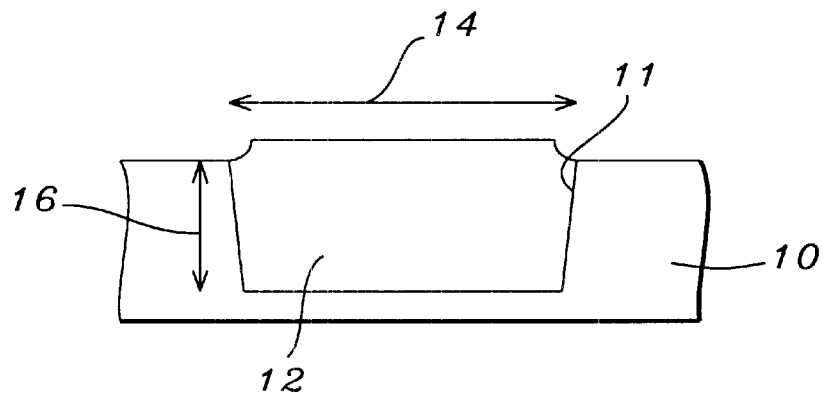
FIGS. 1 to 17 schematically illustrate a preferred embodiment of the present invention.

Initial Structure—FIG. 1

As shown in FIG. 1, substrate 10 has an isolation structure 12 formed therein within trench 11. Substrate 10 is preferably a silicon or a germanium substrate and is more preferably a silicon substrate. Isolation structure 12 is preferably a shallow trench isolation (STI) structure that is preferably comprised of HDP-oxide.

STI 12 has a maximum width 14 of preferably from about 5000 to 10,000 Å and more preferably from about 6000 to 8000 Å, and has a depth 16 within substrate 10 of preferably from about 3000 to 4500 Å and more preferably from about 3500 to 4000 Å.

Figure 2:
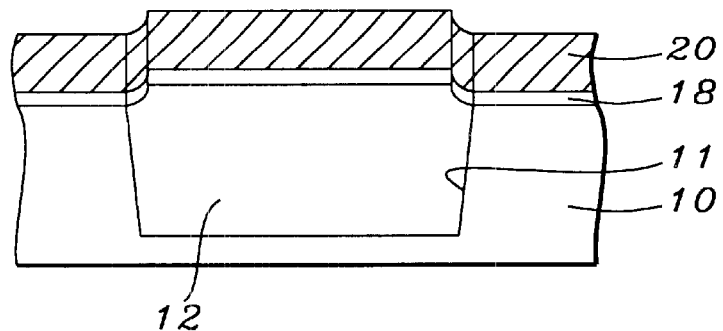

Formation of Pad Oxide Layer 18 and SiN 20—FIG. 2

As shown in FIG. 2, a pad oxide layer 18 is formed on substrate 10 and STI 12 to a thickness of preferably from about 100 to 300 Å and more preferably from about 100 to 200 Å. Pad oxide layer 18 is preferably comprised of silicon oxide ($SiO_2$).

Dielectric layer 20 is formed on pad oxide layer 18 to a thickness of preferably from about 800 to 3000 Å and more preferably from about 1000 to 2000 Å. Dielectric layer 20 is preferably formed using either a plasma enhanced (PE) process or a low pressure (LP) process and is comprised of nitride, silicon nitride ($Si_3N_4$) or silicon oxynitride (SiON) more preferably silicon nitride ($Si_3N_4$) as will be used hereafter for illustrative purposes.

Figure 3:
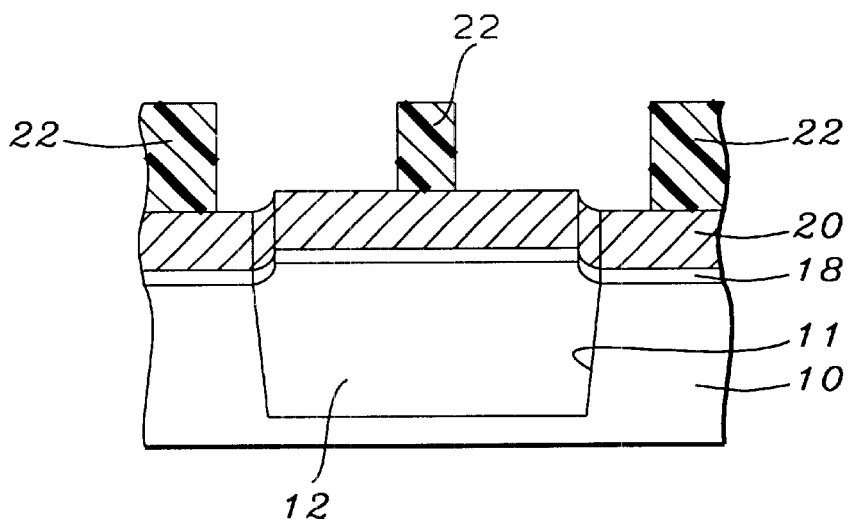

Formation of First Patterned Photoresist Layer 22—FIG. 3

As shown in FIG. 3, to facilitate patterning of the structure of FIG. 2, a first patterned masking layer 22 may be formed over the SiN layer 20. First patterned masking layer 22 is preferably comprised of photoresist (PR).

First patterned PR layer 22 masks a central portion of STI 12 and portions of substrate 10 adjacent STI 12 as shown in FIG. 3.

Figure 4:
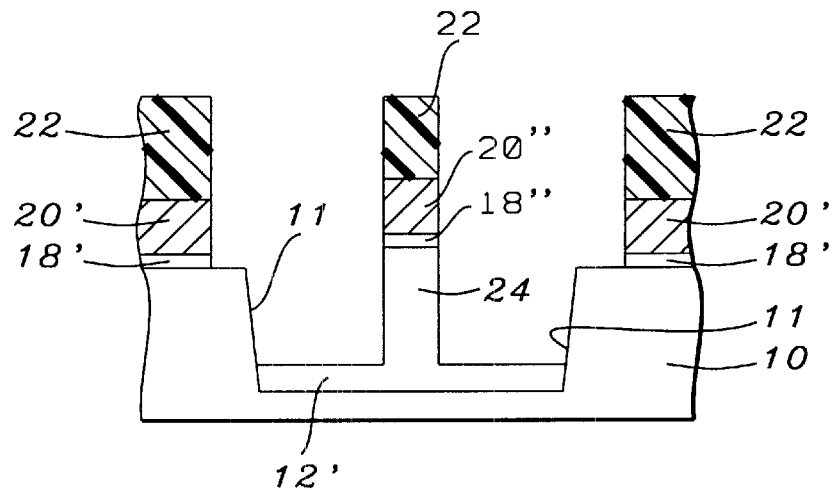

Initial Node 24 Etch—FIG. 4

As shown in FIG. 4, the structure of FIG. 3 is patterned, by for example using the first patterned PR layer 22 as a mask, to form initial crown-like node 24 comprising a portion of partially patterned STI 12', SiN 20"/pad oxide 18" stack over initial node 24 and SiN 20'/pad oxide 18' stacks adjacent partially patterned STI 12'. That is, crown-like node 21 includes all of the remaining STI material remaining trench 11.

Preferably the exposed portions of SiN layer 20 is etched in a first etch step followed by a second etch step to complete the formation of the initial node 24.

Figure 5:
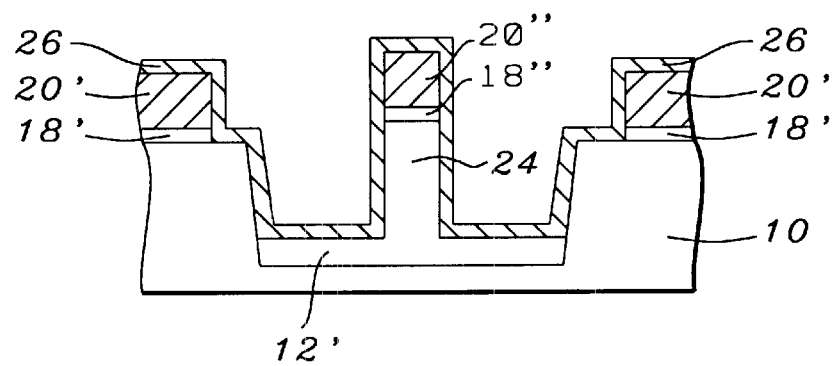

Formation of Bottom Plate Electrode Layer 26—FIG. 5

As shown in FIG. 5, first patterned PR layer 22 is removed and the structure may be cleaned as necessary.

A bottom plate electrode layer 26 is then formed over the structure of FIG. 4 to a thickness of preferably from about 280 to 320 Å, more preferably from about 290 to 310 and most preferably about 300 Å. Bottom plate electrode layer 26 is preferably comprised of polysilicon (poly).

Figure 6:
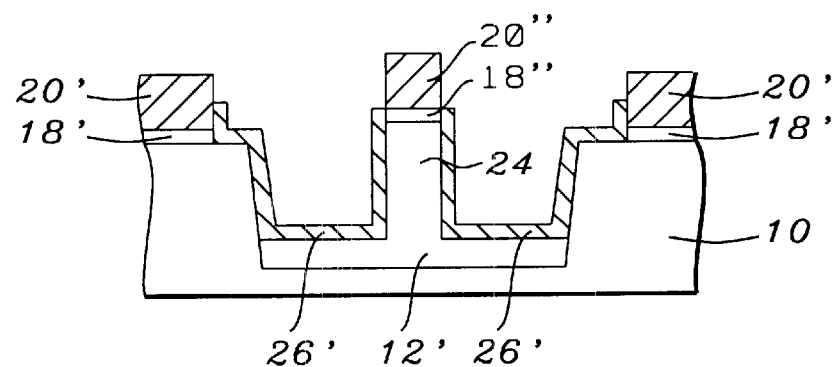

Partial Etching of Bottom Plate Electrode Layer 26—FIG. 6

As shown in FIG. 6, bottom plate electrode layer 26 is partially etched to remove the upper portions of bottom plate electrode layer 26, forming partially etched bottom plate electrode layer 26' at least lining trench 11, initial node 24, substrate 10 adjacent trench 11 and patterned pad oxide layer portions 18', 18". Bottom plate electrode layer 26 is preferably etched using a patterned masking layer.

Figure 7:
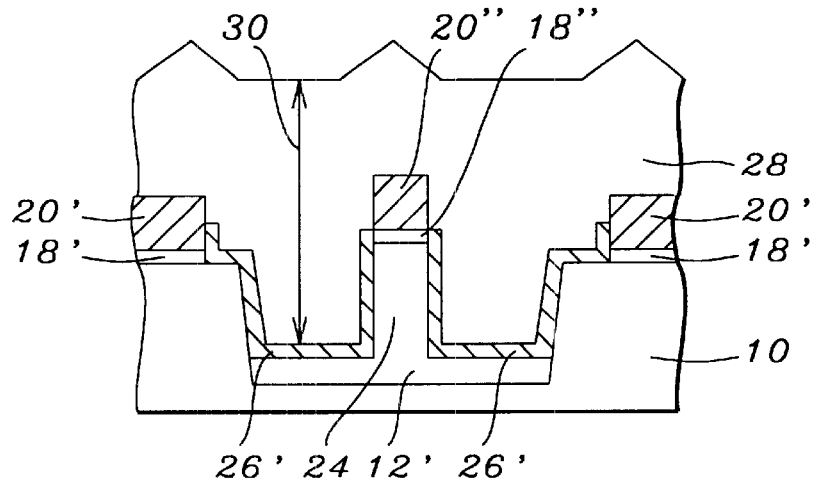

Formation of HDP or LDR Dielectric Layer 28—FIG. 7

As shown in FIG. 7, a dielectric layer 28 is formed over the structure of FIG. 6 and at least filling trench 11 and covering SiN 20"/pad oxide 18" stack and SiN 20'/pad oxide 18' stacks. Dielectric layer 28 is preferably formed by a high-density plasma (HDP) process or a low-deposition rate (LDR) process and is preferably comprised of oxide or silicon oxide.

HDP/LDP oxide layer 28 has a thickness 30 from bottom plate electrode layer 26' lined trench 11 of preferably from about 6000 to 10,000 Å and more preferably from about 7000 to 8000 Å.

Figure 8:
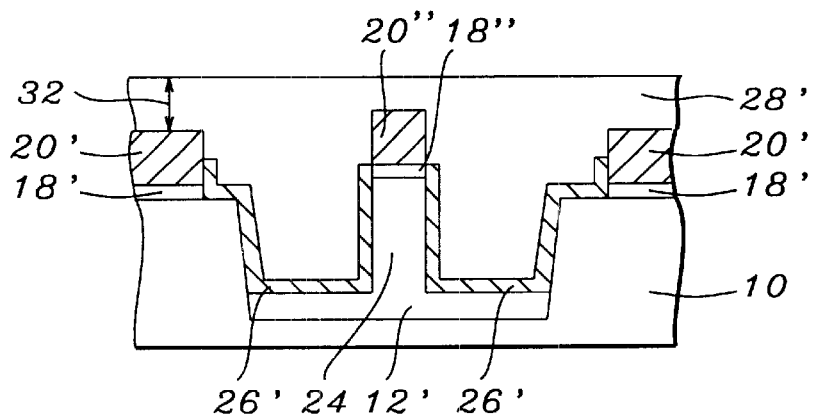

Planarization of HDP/LDP Oxide Layer 28—FIG. 8

In one important step, and as shown in FIG. 8, HDP/LDP oxide layer 28 is planarized, preferably using a chemical mechanical polishing (CMP) process, to form planarized HDP/LDP oxide layer 28' having a thickness 32 over the patterned SiN layer portions 20', 20" of preferably from about 1000 to 4000 Å and more preferably from about 2000 to 3000 Å.

Figure 9:
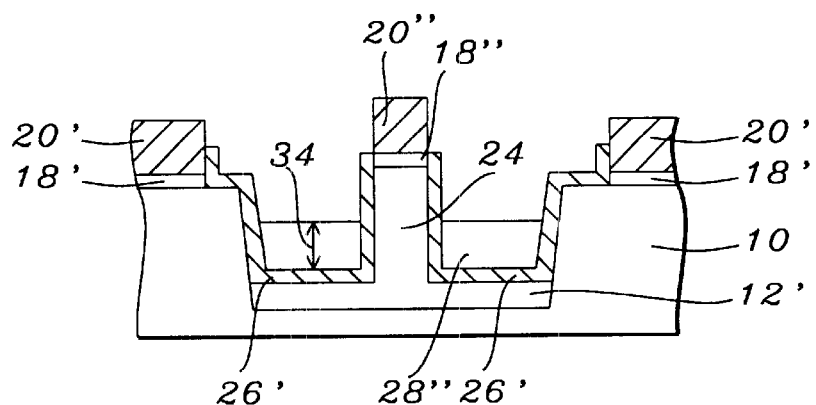

Recessing of Planarized HDP/LDP Oxide Layer 28'—FIG. 9

As shown in FIG. 9, planarized HDP/LDP oxide layer 28' is recessed within node 24/trench 11 to a thickness 34 above bottom plate electrode layer 26' of preferably from about 900 to 2100 Å and more preferably from about 1000 to 2000 Å. Recessed HDP/LDP oxide layer 28" must remain within that portion of the trench 11 lined by the bottom plate electrode layer 26' as that portion of the bottom plate electrode layer 26' will function as a buffer layer for the next etch step (see FIG. 10 description).

Figure 10:
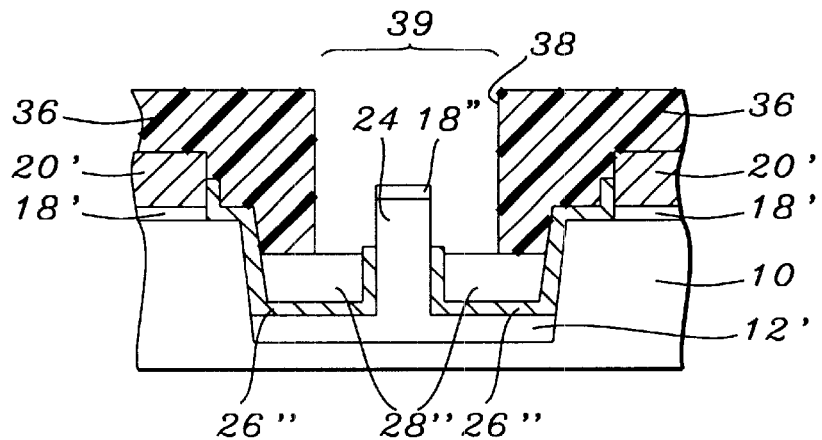

Formation of Second Patterned Mask Layer 36—FIG. 10

As shown in FIG. 10 a second patterned mask layer 36 having opening 38 is formed over the structure of FIG. 9 to expose a portion of initial crown-like node 24 within region 39 including patterned SiN portion 20", a portion of recessed HDP/LDP oxide layer 28" and a portion of bottom plate electrode layer 26'.

Second patterned mask layer 36 is preferably comprised of photoresist (PR).

Removal of SiN Portion 20" and Exposed Portion of Bottom Plate Electrode Layer 26' Within Region 39

As further shown in FIG. 10, and using second patterned PR layer 36 as a mask, the central patterned SiN portion 20" and the exposed portion of bottom plate electrode layer 26' within region 39 are removed/recessed to leave a recessed bottom plate electrode layer 26".

Figure 11:
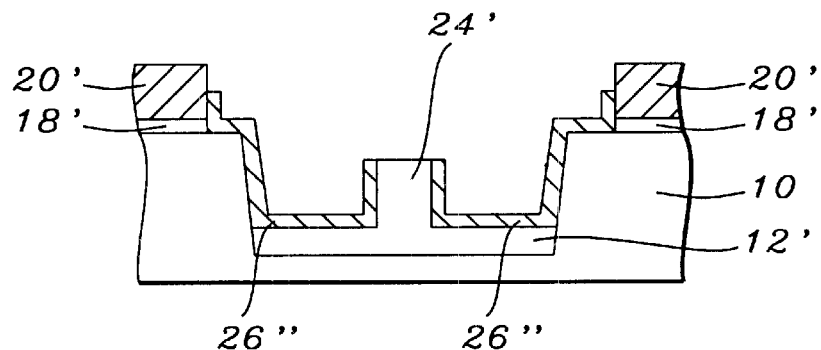

Removal of Second Patterned PR Layer 36 And Plasma Dry Etch—FIG. 11

As shown in FIG. 11, second patterned PR layer 36 is removed and the structure may be cleaned as necessary.

The (1) exposed patterned central pad oxide 18", (2) the exposed recessed HDP/LDP oxide layer 28" and (3) the exposed central portion of initial crown-like node 24 above recessed bottom plate electrode layer 26" are removed leaving a final crown-like node 24' These portions are removed preferably using an oxide plasma dry etch process. Alternatively, and less preferably, a wet etch may be used such as BOE or dilute HF.

Figure 12:
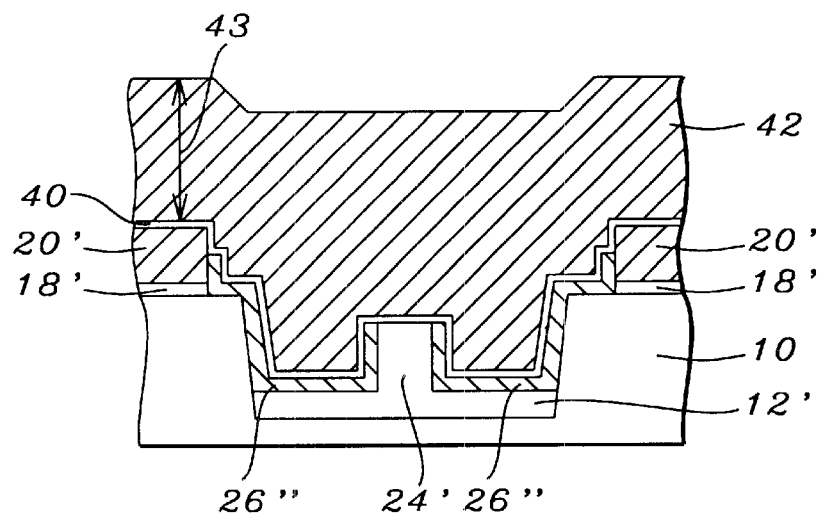

Formation of Cap Dielectric Layer 40 and Top Plate Dielectric Layer 42—FIG. 12

As shown in FIG. 12, a cap dielectric layer 40 is formed over the structure of FIG. 11 to a thickness of preferably from about 30 to 100 Å and more preferably from about 40 to 60 Å. Cap dielectric layer 40 is preferably comprised of NO.

A thick top plate dielectric layer 42 is then formed over the NO cap layer 40 to a thickness of 43 above the NO cap layer 40 covered SiN portions 20' of preferably from about 4000 to 8000 Å and more preferably from about 5000 to 6000 Å. Top plate dielectric layer 42 is preferably comprised of polysilicon (poly).

Figure 13:
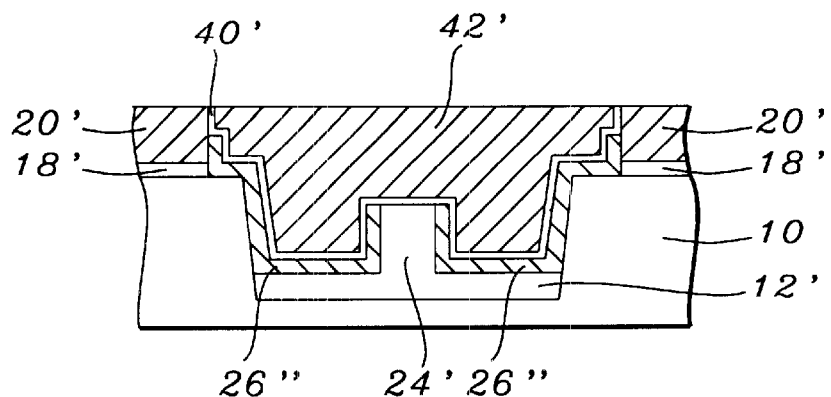

Planarization of Top Plate Poly Layer 42—FIG. 13

As shown in FIG. 13, top plate poly layer 42 is planarized, stopping on the SIN portions 20' and so removing the portions of NO cap layer 40 overlying SiN portions 20', to form a planarized top plate poly layer 42'. Top plate poly layer 42 is preferably planarized using a chemical mechanical polishing (CMP) process.

Figure 14:
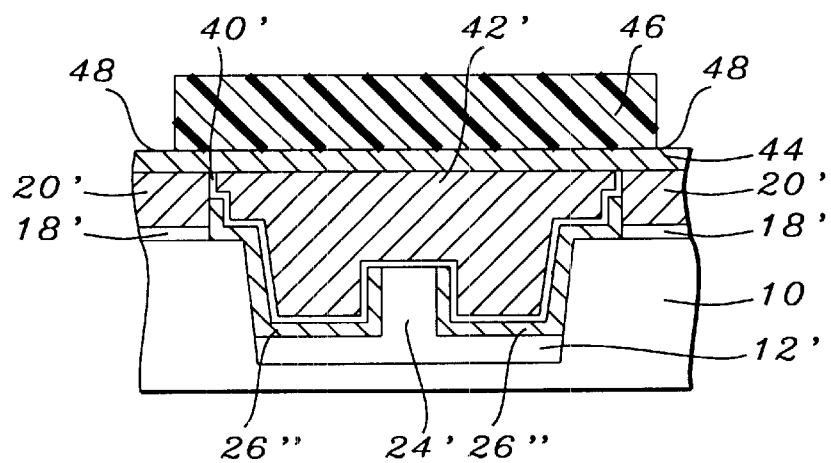

Formation of Dielectric Layer 44—FIG. 14

As shown in FIG. 14, a photo anti-reflective coating (ARC) layer 44 is formed over the planarized top plate poly layer 42' and the SiN portions 20' to a thickness of preferably from about 200 to 600 Å and more preferably from about 300 to 400 Å. ARC layer 44 is preferably comprised of $Si_3N_4$ or SiON and is more preferably SiON.

Formation of Third Patterned Mask Layer 46—FIG. 14

As shown in FIG. 14, a third patterned mask layer 46 is formed over SiN/SiON ARC layer 44 leaving exposed peripheral portions 48 of SiN/SiON ARC layer 44 that overlie a portion of SiN portions 20". Third patterned masking layer 46 is preferably comprised of photoresist (PR).

Patterning of Exposed SiN/SiON Layer Portions 48 and Underlying SiN Portions 20'''

Figure 15:
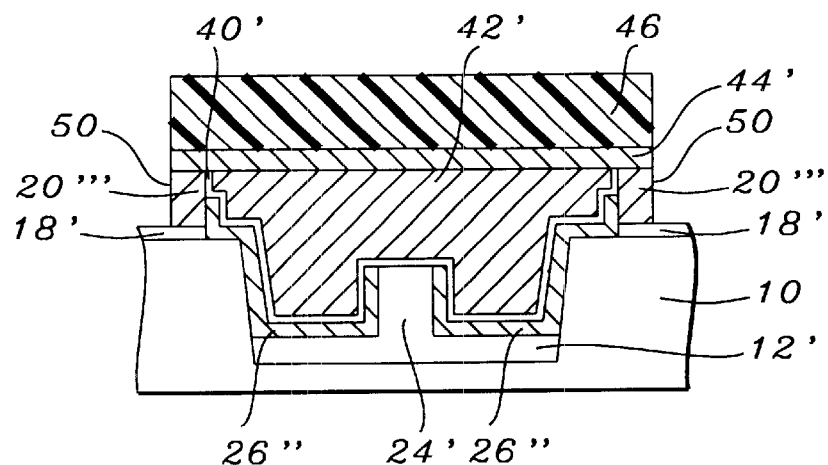

As shown in FIG. 15, using the third patterned PR layer 46 as a mask, the exposed SiN/SiON layer portions 48 and the underlying SiN portions 20'' are patterned, stopping on the pad oxide portions 18' with the pad oxide portions 18' acting to protect the silicon substrate 10. This patterning is preferably done using a plasma dry etch process such as an $Si_3N_4$ etch process having etch selectivity to pad oxide portions 18'.

Patterned SiN portions 20''' have exposed side walls 50.

Figure 16:
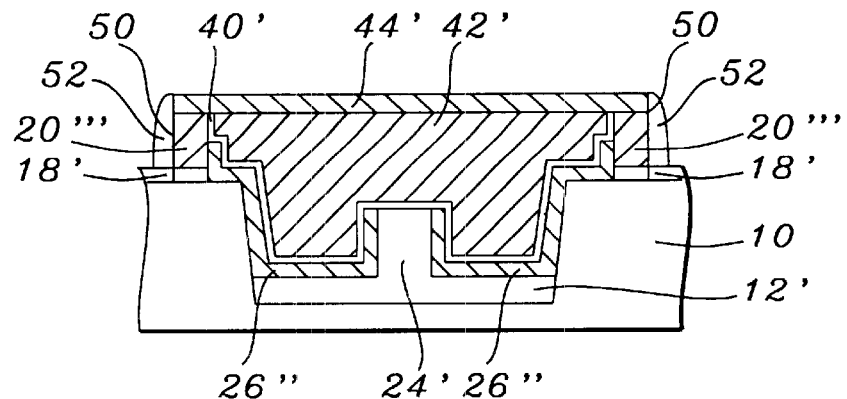

Removal of Third Patterned PR Layer 46—FIG. 16

As shown in FIG. 16, third patterned PR layer 46 is removed from the structure of FIG. 15 and the structure may be cleaned as necessary.

Formation of Sidewall Spacers 52 Over The Exposed SiN Portions Side Walls 50—FIG. 16

As shown in FIG. 16, sidewall spacers 52 are formed over the exposed side walls 50 of patterned SiN portions 20''' to a base width of preferably from about 300 to 1000 Å and more preferably from about 500 to 700 Å to leave preferably from about 290 to 310 Å of and more preferably about 300 Å of pad oxide portions 18' exposed. Sidewall spacers 52 are preferably comprised of a conformal dielectric layer such as low-deposition rate (LDR) oxide or low pressure (LP)—TEOS oxide.

Sidewall spacers 52 may be formed by, for example, depositing a conformal LDR oxide or LP-TEOS oxide layer and then patterning that conformal layer to form the sidewall spacers 52.

Removal of Exposed Pad Oxide Portions 18' to Form Final 1T-SRAM 100

Figure 17:
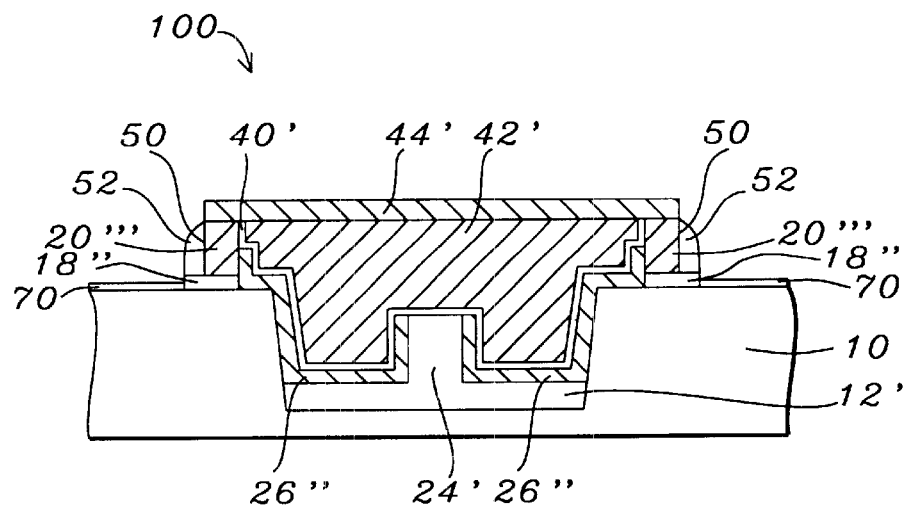

As shown in FIG. 17, the exposed portions of pad oxide portions 18' are removed, preferably by an etch process to leave remaining pad oxide portions 18'' and forming 1T-SRAM 100. Gate oxide layer portions 70 may then be grown over the portions of substrate 10 exposed by the removal of the pad oxide portions 18''.

The oxide sidewall spacers 52 remain to prevent polysilicon residue on the next transistor gate etch because the sidewall spacers 52 will form a smooth step height and not a right angle step height.

Figure 18:
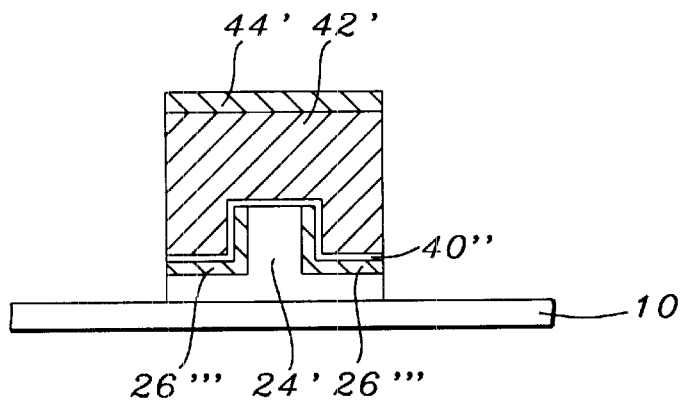
FIG. 18 is a cross-sectional view of FIG. 20 along line 18—18.

FIG. 18 is a top-down, plan view of the 1T-SRAM 100 cell memory with FIG. 17 being a cross-sectional view of FIG. 18 along line 17—17.

Figure 19:
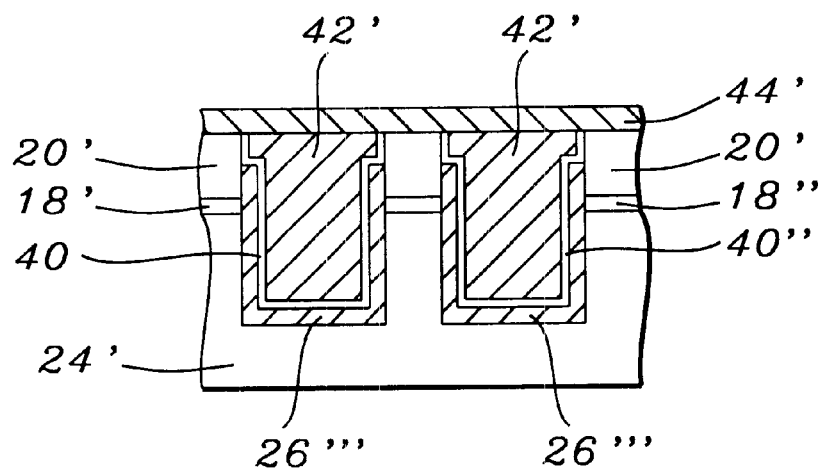
FIG. 19 is a cross-sectional view of FIG. 20 along line 19—19.
Figure 20:
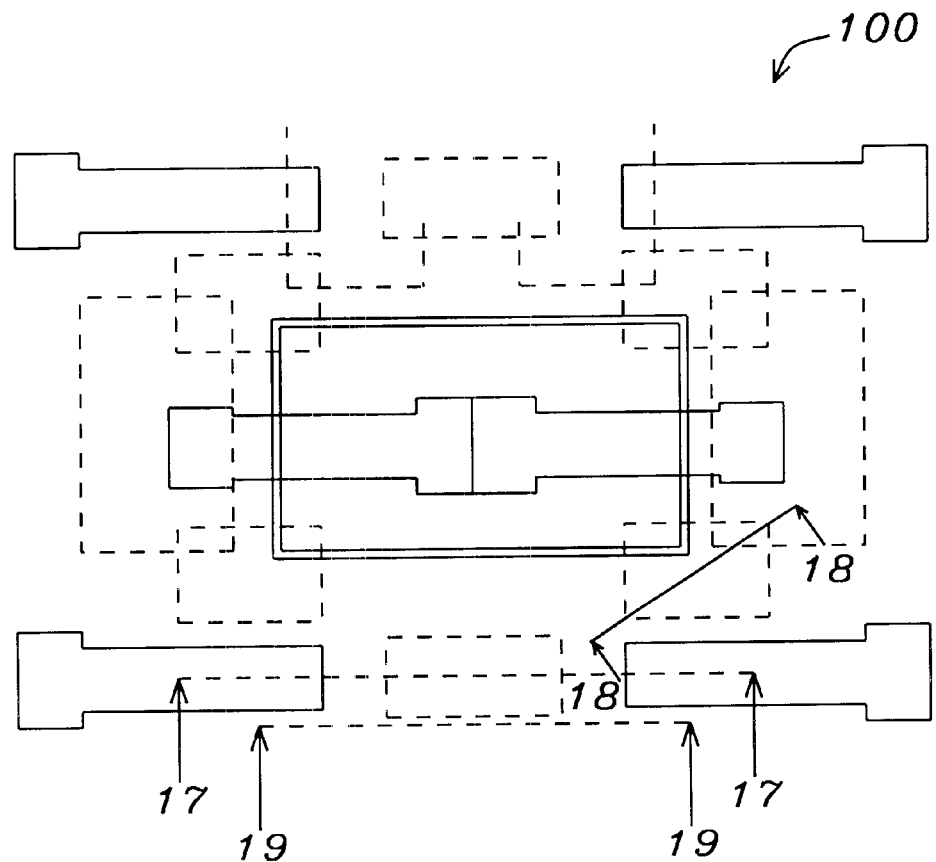
FIG. 20 is a plan view of FIG. 17, with FIG. 17 being a cross-sectional view of FIG. 20 along line 17—17.

FIG. 19 is a cross-sectional view of FIG. 18 along line 18—18 and FIG. 20 is a cross-sectional view of FIG. 18 along line 20—20. FIGS. 19 and 20 illustrate the good isolation achieved in forming the 1T-SRAM structure 100 in accordance with the method of the present invention.

Advantages of the Present Invention

The advantages of one or more embodiments of the present invention include:
1. the planarization of the cell storage node;
2. good isolation between the transistor and storage node;
3. reduced step height for the cell transistor; and
4. has the potential for increasing the node capacitance (like DRAM storage node).

While particular embodiments of the present invention have been illustrated and described, it is not intended to limit the invention, except as defined by the following claims.

We claim:

1. A method of forming a cell memory structure, comprising the steps of:
   providing a substrate having an isolation trench formed therein;
   forming an isolation structure within the isolation trench;
   forming a pad oxide layer over the substrate and the isolation structure;
   forming a first dielectric layer over the pad oxide layer;
   patterning the first dielectric layer, the pad oxide layer and the isolation structure to form at least:
   a) an initial node within the isolation trench; a portion of the initial node having an overlying patterned pad oxide layer portion and an overlying patterned first dielectric layer portion; and
   b) patterned first dielectric portions having underlying pad oxide layer portions over the substrate adjacent the isolation trench;
   forming a bottom plate electrode layer over the initial node, the substrate and the patterned first dielectric layer portions over the substrate;
   removing a portion of the bottom plate electrode layer, leaving a partially removed bottom plate electrode layer overlying at least the isolation trench, the initial node and any exposed substrate adjacent the isolation trench;
   forming a planarized second dielectric layer over the structure at least filling isolation trench and overlying the initial node and the patterned first dielectric layer portions over the substrate;
   removing a portion of the planarized second dielectric layer leaving only recessed portions of the second dielectric layer within isolation trench;
   removing:
   i) a portion of the bottom plate electrode layer overlying the initial node adjacent the patterned first dielectric layer portion, leaving a portion of the initial node exposed; and
   ii) the patterned first dielectric layer portion from the initial node;
   removing the second dielectric layer recessed portions, the patterned pad oxide layer portion overlying the initial node and the exposed portion of the initial node to leave a final node;
   forming a cap dielectric layer over the structure;
   forming a top plate dielectric layer over the cap dielectric layer and at least filling the isolation trench, overlying the final node and the patterned first dielectric layer portions over the substrate;
   planarizing the top plate dielectric layer, stopping on the patterned first dielectric layer portions over the substrate;
   forming an ARC layer over the planarized top plate dielectric layer;
   patterning:
   I) the ARC layer; and
   II) the patterned first dielectric layer portions over the substrate to expose side walls, stopping on the underlying pad oxide layer portions;
   forming sidewall spacers on the exposed side walls of the twice patterned first dielectric layer portions over the substrate, leaving peripheral portions of the underlying pad oxide layer exposed; and
   removing the peripheral exposed portions of the underlying pad oxide layer to leave remaining pad oxide layer portions and forming the cell memory structure.

2. The method of claim 1, wherein the substrate is a silicon substrate or germanium substrate.

3. The method of claim 1, wherein the substrate is a silicon substrate.

4. The method of claim 1, wherein the isolation structure is a shallow trench isolation structure.

5. The method of claim 1, wherein the isolation structure is a shallow trench isolation structure comprised of HDP-oxide.

6. The method of claim 1, wherein the isolation structure has a maximum width of from about 5000 to 10,000 Å and a depth of from about 3000 to 4500 Å.

7. The method of claim 1, wherein the pad oxide layer has a thickness of from about 100 to 300 Å; the first dielectric layer has a thickness of from about 800 to 3000 Å; the bottom plate electrode layer has a thickness of from about 280 to 320 Å; the planarized second dielectric layer has a thickness of from about 1000 to 4000 Å above the patterned first dielectric layer portions over the substrate; the cap dielectric layer has a thickness of from about 30 to 100 Å; the ARC layer has a thickness of from about 200 to 600 Å; and the sidewall spacers have a base width of from about 300 to 1000 Å.

8. The method of claim 1, wherein the pad oxide layer has a thickness of from about 100 to 200 Å; the first dielectric layer has a thickness of from about 1000 to 2000 Å; the bottom plate electrode layer has a thickness of from about 290 to 310 Å; the planarized second dielectric layer has a thickness of from about 2000 to 3000 Å above the patterned first dielectric layer portions over the substrate; the cap dielectric layer has a thickness of from about 40 to 60 Å; the ARC layer has a thickness of from about 300 to 400 Å; and the sidewall spacers have a base width of from about 500 to 700 Å.

9. The method of claim 1, wherein
the pad oxide layer is comprised of $SiO_2$;
the first dielectric layer is comprised of nitride, silicon nitride or silicon oxynitride;
the bottom plate electrode layer is comprised of polysilicon;
the planarized second dielectric layer is comprised of HDP-oxide, LDR-oxide, HDP-silicon oxide or LDR-silicon oxide;
the cap dielectric layer is comprised of NO;
the ARC layer is comprised of $Si_3N_4$ or SiON; and
the sidewall spacers are comprised of LDR-oxide or LP-TEOS oxide.

10. The method of claim 1, wherein
the pad oxide layer is comprised of $SiO_2$;
the first dielectric layer is comprised of silicon nitride;
the bottom plate electrode layer is comprised of polysilicon;
the planarized second dielectric layer is comprised of HDP-silicon oxide or LDR-silicon oxide;
the cap dielectric layer is comprised of NO;
the ARC layer is comprised of SiON; and
the sidewall spacers are comprised of LDR-oxide or LP-TEOS oxide.

11. The method of claim 1, wherein the exposed peripheral portions of the underlying pad oxide layer have a width of from about 290 to 310 Å.

12. The method of claim 1, wherein the exposed peripheral portions of the underlying pad oxide layer have a width of about 300 Å.

13. The method of claim 1, whereby the removal of the peripheral exposed portions of the underlying pad oxide layer leaves portions of the substrate thereunder exposed; and including the step of forming gate oxide layer portions over the exposed portions of the substrate after the removal of the peripheral exposed portions of the underlying pad oxide layer.

14. A method of forming a cell memory structure, comprising the steps of:
providing a substrate having an isolation trench formed therein;
forming an isolation structure within the isolation trench;
forming a pad oxide layer over the substrate and the isolation structure;
forming a first dielectric layer over the pad oxide layer;
patterning the first dielectric layer, the pad oxide layer and the isolation structure to form at least:
  a) an initial node within the isolation trench; a portion of the initial node having an overlying patterned pad oxide layer portion and an overlying patterned first dielectric layer portion; and
  c) patterned first dielectric portions having underlying pad oxide layer portions over the substrate adjacent the isolation trench;
forming a bottom plate electrode layer over the initial node, the substrate and the patterned first dielectric layer portions over the substrate;
removing a portion of the bottom plate electrode layer, leaving a partially removed bottom plate electrode layer overlying at least the isolation trench, the initial node and any exposed substrate adjacent the isolation trench;
forming a planarized second dielectric layer over the structure at least filling isolation trench and overlying the initial node and the patterned first dielectric layer portions over the substrate;
removing a portion of the planarized second dielectric layer leaving only recessed portions of the second dielectric layer within isolation trench;
removing:
  i) a portion of the bottom plate electrode layer overlying the initial node adjacent the patterned first dielectric layer portion, leaving a portion of the initial node exposed; and
  ii) the patterned first dielectric layer portion from the initial node;
removing the second dielectric layer recessed portions, the patterned pad oxide layer portion overlying the initial node and the exposed portion of the initial node to leave a final node;
forming a cap dielectric layer over the structure;
forming a top plate dielectric layer over the cap dielectric layer and at least filling the isolation trench, overlying the final node and the patterned first dielectric layer portions over the substrate;
planarizing the top plate dielectric layer, stopping on the patterned first dielectric layer portions over the substrate;
forming an ARC layer over the planarized top plate dielectric layer;
patterning:
  I) the ARC layer; and
  II) the patterned first dielectric layer portions over the substrate to expose side walls, stopping on the underlying pad oxide layer portions;
forming sidewall spacers on the exposed side walls of the twice patterned first dielectric layer portions over the substrate, leaving peripheral portions of the underlying pad oxide layer exposed;
removing the peripheral exposed portions of the underlying pad oxide layer to leave remaining pad oxide layer portions and forming the cell memory structure; the removal of the peripheral exposed portions of the underlying pad oxide layer also leaving portions of the substrate thereunder exposed; and forming gate oxide layer portions over the exposed portions of the substrate.

15. The method of claim 14, wherein the substrate is a silicon substrate or germanium substrate.

16. The method of claim 14, wherein the substrate is a silicon substrate.

17. The method of claim 14, wherein the isolation structure is a shallow trench isolation structure.

18. The method of claim 14, wherein the isolation structure is a shallow trench isolation structure comprised of HDP-oxide.

19. The method of claim 14, wherein the isolation structure has a maximum width of from about 5000 to 10,000 Å and a depth of from about 3000 to 4500 Å.

20. The method of claim 14, wherein the pad oxide layer has a thickness of from about 100 to 300 Å; the first dielectric layer has a thickness of from about 800 to 3000 Å; the bottom plate electrode layer has a thickness of from about 280 to 320 Å; the planarized second dielectric layer has a thickness of from about 1000 to 4000 Å above the patterned first dielectric layer portions over the substrate; the cap dielectric layer has a thickness of from about 30 to 100 Å; the ARC layer has a thickness of from about 200 to 600 Å; and the sidewall spacers have a base width of from about 300 to 1000 Å.

21. The method of claim 14, wherein the pad oxide layer has a thickness of from about 100 to 200 Å; the first dielectric layer has a thickness of from about 1000 to 2000 Å; the bottom plate electrode layer has a thickness of from about 290 to 310 Å; the planarized second dielectric layer has a thickness of from about 2000 to 3000 Å above the patterned first dielectric layer portions over the substrate; the cap dielectric layer has a thickness of from about 40 to 60 Å; the ARC layer has a thickness of from about 300 to 400 Å; and the sidewall spacers have a base width of from about 500 to 700 Å.

22. The method of claim 14, wherein
the pad oxide layer is comprised of $SiO_2$;
the first dielectric layer is comprised of nitride, silicon nitride or silicon oxynitride;
the bottom plate electrode layer is comprised of polysilicon;
the planarized second dielectric layer is comprised of HDP-oxide, LDR-oxide, HDP-silicon oxide or LDR-silicon oxide;
the cap dielectric layer is comprised of NO;
the ARC layer is comprised of $Si_3N_4$ or SiON; and
the sidewall spacers are comprised of LDR-oxide or LP-TEOS oxide.

23. The method of claim 14, wherein
the pad oxide layer is comprised of $SiO_2$;
the first dielectric layer is comprised of silicon nitride;
the bottom plate electrode layer is comprised of polysilicon;
the planarized second dielectric layer is comprised of HDP-silicon oxide or LDR-silicon oxide;
the cap dielectric layer is comprised of NO;
the ARC layer is comprised of SiON; and
the sidewall spacers are comprised of LDR-oxide or LP-TEOS oxide.

24. The method of claim 14, wherein the exposed peripheral portions of the underlying pad oxide layer have a width of from about 290 to 310 Å.

25. The method of claim 14, wherein the exposed peripheral portions of the underlying pad oxide layer have a width of about 300 Å.

26. A method of forming a cell memory structure, comprising the steps of:
providing a substrate having an isolation trench formed therein; the substrate being a silicon substrate or germanium substrate;
forming an isolation structure within the isolation trench;
forming a pad oxide layer over the substrate and the isolation structure;
forming a first dielectric layer over the pad oxide layer;
patterning the first dielectric layer, the pad oxide layer and the isolation structure to form at least:
  a) an initial node within the isolation trench; a portion of the initial node having an overlying patterned pad oxide layer portion and an overlying patterned first dielectric layer portion; and
  c) patterned first dielectric portions having underlying pad oxide layer portions over the substrate adjacent the isolation trench;
forming a bottom plate electrode layer over the initial node, the substrate and the patterned first dielectric layer portions over the substrate;
removing a portion of the bottom plate electrode layer, leaving a partially removed bottom plate electrode layer overlying at least the isolation trench, the initial node and any exposed substrate adjacent the isolation trench;
forming a planarized second dielectric layer over the structure at least filling isolation trench and overlying the initial node and the patterned first dielectric layer portions over the substrate;
removing a portion of the planarized second dielectric layer leaving only recessed portions of the second dielectric layer within isolation trench;
removing:
  i) a portion of the bottom plate electrode layer overlying the initial node adjacent the patterned first dielectric layer portion, leaving a portion of the initial node exposed; and
  ii) the patterned first dielectric layer portion from the initial node;
removing the second dielectric layer recessed portions, the patterned pad oxide layer portion overlying the initial node and the exposed portion of the initial node to leave a final node;
forming a cap dielectric layer over the structure;
forming a top plate dielectric layer over the cap dielectric layer and at least filling the isolation trench, overlying the final node and the patterned first dielectric layer portions over the substrate;
planarizing the top plate dielectric layer, stopping on the patterned first dielectric layer portions over the substrate;
forming an ARC layer over the planarized top plate dielectric layer;
patterning:
  I) the ARC layer; and
  II) the patterned first dielectric layer portions over the substrate to expose side walls, stopping on the underlying pad oxide layer portions;

forming sidewall spacers on the exposed side walls of the twice patterned first dielectric layer portions over the substrate, leaving peripheral portions of the underlying pad oxide layer exposed; and removing the peripheral exposed portions of the underlying pad oxide layer to leave remaining pad oxide layer portions and forming the cell memory structure.

27. The method of claim 26, wherein the substrate is a silicon substrate.

28. The method of claim 26, wherein the isolation structure is a shallow trench isolation structure.

29. The method of claim 26, wherein the isolation structure is a shallow trench isolation structure comprised of HDP-oxide.

30. The method of claim 26, wherein the isolation structure has a maximum width of from about 5000 to 10,000 Å and a depth of from about 3000 to 4500 Å.

31. The method of claim 26, wherein the pad oxide layer has a thickness of from about 100 to 300 Å; the first dielectric layer has a thickness of from about 800 to 3000 Å; the bottom plate electrode layer has a thickness of from about 280 to 320 Å; the planarized second dielectric layer has a thickness of from about 1000 to 4000 Å above the patterned first dielectric layer portions over the substrate; the cap dielectric layer has a thickness of from about 30 to 100 Å; the ARC layer has a thickness of from about 200 to 600 Å; and the sidewall spacers have a base width of from about 300 to 1000 Å.

32. The method of claim 26, wherein the pad oxide layer has a thickness of from about 100 to 200 Å; the first dielectric layer has a thickness of from about 1000 to 2000 Å; the bottom plate electrode layer has a thickness of from about 290 to 310 Å; the planarized second dielectric layer has a thickness of from about 2000 to 3000 Å above the patterned first dielectric layer portions over the substrate; the cap dielectric layer has a thickness of from about 40 to 60 Å; the ARC layer has a thickness of from about 300 to 400 Å; and the sidewall spacers have a base width of from about 500 to 700 Å.

33. The method of claim 26, wherein
the pad oxide layer is comprised of $SiO_2$;
the first dielectric layer is comprised of nitride, silicon nitride or silicon oxynitride;
the bottom plate electrode layer is comprised of polysilicon;
the planarized second dielectric layer is comprised of HDP-oxide, LDR-oxide, HDP-silicon oxide or LDR-silicon oxide;
the cap dielectric layer is comprised of NO;
the ARC layer is comprised of $Si_3N_4$ or SiON; and
the sidewall spacers are comprised of LDR-oxide or LP-TEOS oxide.

34. The method of claim 26, wherein the pad oxide layer is comprised of $SiO_2$;
the first dielectric layer is comprised of silicon nitride;
the bottom plate electrode layer is comprised of polysilicon;
the planarized second dielectric layer is comprised of HDP-silicon oxide or LDR-silicon oxide;
the cap dielectric layer is comprised of NO;
the ARC layer is comprised of SiON; and
the sidewall spacers are comprised of LDR-oxide or LP-TEOS oxide.

35. The method of claim 26, wherein the exposed peripheral portions of the underlying pad oxide layer have a width of from about 290 to 310 Å.

36. The method of claim 26, wherein the exposed peripheral portions of the underlying pad oxide layer have a width of about 300 Å.

37. The method of claim 26, whereby the removal of the peripheral exposed portions of the underlying pad oxide layer leaves portions of the substrate thereunder exposed; and including the step of forming gate oxide layer portions over the exposed portions of the substrate after the removal of the peripheral exposed portions of the underlying pad oxide layer.

* * * * *